United States Patent [19]

Birkner et al.

[11] Patent Number: 4,758,746

[45] Date of Patent: Jul. 19, 1988

[54] PROGRAMMABLE LOGIC ARRAY WITH ADDED ARRAY OF GATES AND ADDED OUTPUT ROUTING FLEXIBILITY

[75] Inventors: John Birkner, Sunnyvale; Hua T. Chua, Los Altos Hills; Andrew K. L. Chan, Milpitas; Albert Chan, San Jose, all of Calif.

[73] Assignee: Monolithic Memories, Inc., Santa Clara, Calif.

[21] Appl. No.: 765,038

[22] Filed: Aug. 12, 1985

[51] Int. Cl.$^4$ .......................................... H03K 19/177
[52] U.S. Cl. .................................. 307/465; 307/468; 307/473; 364/716
[58] Field of Search ................. 307/202.1, 465, 445, 307/468–469, 443, 475, 473; 340/825.83, 825.84, 825.87; 364/716

[56] References Cited

U.S. PATENT DOCUMENTS

| | | | |
|---|---|---|---|
| 3,818,252 | 6/1974 | Chiba et al. | 307/303 |
| 3,936,812 | 2/1976 | Cox et al. | 365/94 X |
| 4,124,899 | 11/1978 | Birkner et al. | 307/465 |
| 4,177,452 | 12/1979 | Balasubramanian et al. | 307/468 X |
| 4,267,463 | 5/1981 | Mayumi | 307/465 X |
| 4,422,072 | 12/1983 | Cavlan | 307/465 X |
| 4,488,230 | 12/1984 | Harrison | 364/716 X |
| 4,488,246 | 12/1984 | Brice | 364/716 |
| 4,506,341 | 3/1985 | Kalter et al. | 307/465 X |
| 4,642,487 | 2/1987 | Carter | 307/465 |

FOREIGN PATENT DOCUMENTS

| 57-824 | 4/1983 | Japan | 307/465 |
|---|---|---|---|
| 2138189 | 10/1984 | United Kingdom | 307/469 |

OTHER PUBLICATIONS

Davis, "Inverted AND Array In PLA Structure"; IBM-TDB; vol. 25, No. 12, pp. 6488–6490; 5/1983.
Altera EP310 Erasable Programmable Logic Device Data Sheet, published in 1985 by Altera Corporation.
AmPAL22V10 Data Sheet, published in May, 1984 by Advanced Micro Devices Corporation.
Ricoh CMOS EPL Series 20A and 20B Data Sheets, published in Oct., 1985 by Ricoh.
"LSI Databook", published by Monolithic Memories, Inc. in 1985, pp. 5-41 to 5-80.
"PAL Programmable Array Logic Handbook", published by Monolithic Memories, Inc. in 1983, pp. 3-24 to 3-52.
Ricoh CMOS Electrically Programmable Logic Data Sheet (Japanese Language).

Primary Examiner—Stanley D. Miller
Assistant Examiner—D. R. Hudspeth
Attorney, Agent, or Firm—Alan H. MacPherson; Kenneth E. Leeds; Paul J. Winters

[57] ABSTRACT

A programmable logic array (100) includes a set of input terms which are programmably coupled to a first set of AND gates (102-1) through 102-66). The output signals from the first set of AND gates are programambly electrically connected to a second set of AND gates (104-1 through 104-66). The second set of programmable AND gates enhances flexibility of design and permits product terms with a larger number of factors to be generated. The output leads from the second set of AND gates are programmably electrically coupled to a first set of OR gates (106-1 through 106-22) which in turn are programably electrically coupled to a second array of OR gate logic (108-1 through 108-10). This also permits greater design flexibility. The output terms from the second set of OR gate logic can then be used to generate the output signals from the programmable logic array (100). In addition, a bus (110) is programmably electrically coupled to each of the output signals from the second OR logic array and the output signals ($O_1$ through $O_{10}$) of the PLA. Because of this, different output terms can be routed to different output pins thus permitting the designer to select his pin out independently of the availability of gate within specific parts of the array.

29 Claims, 9 Drawing Sheets

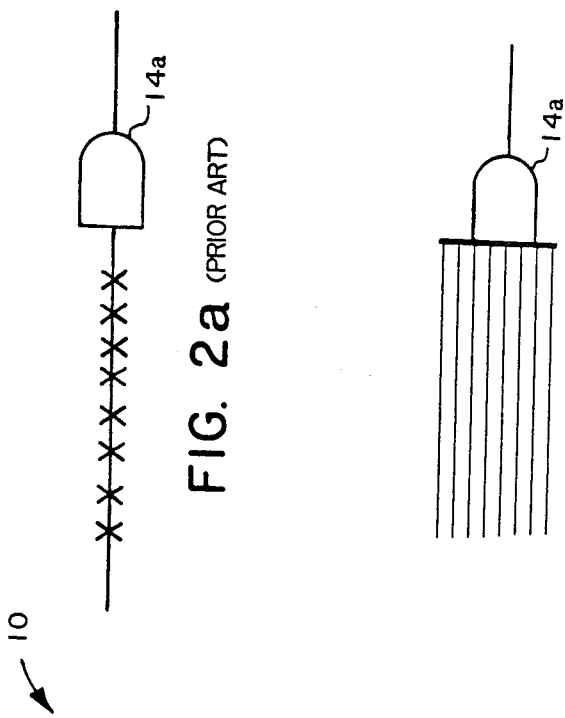
FIG. 2a (PRIOR ART)
FIG. 2b (PRIOR ART)
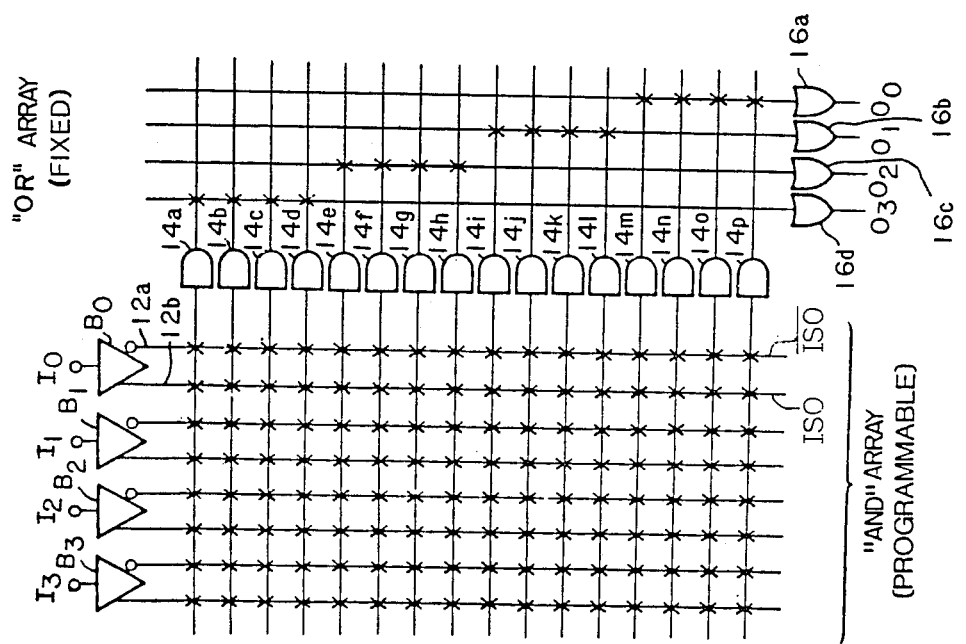
FIG. 1 (PRIOR ART)

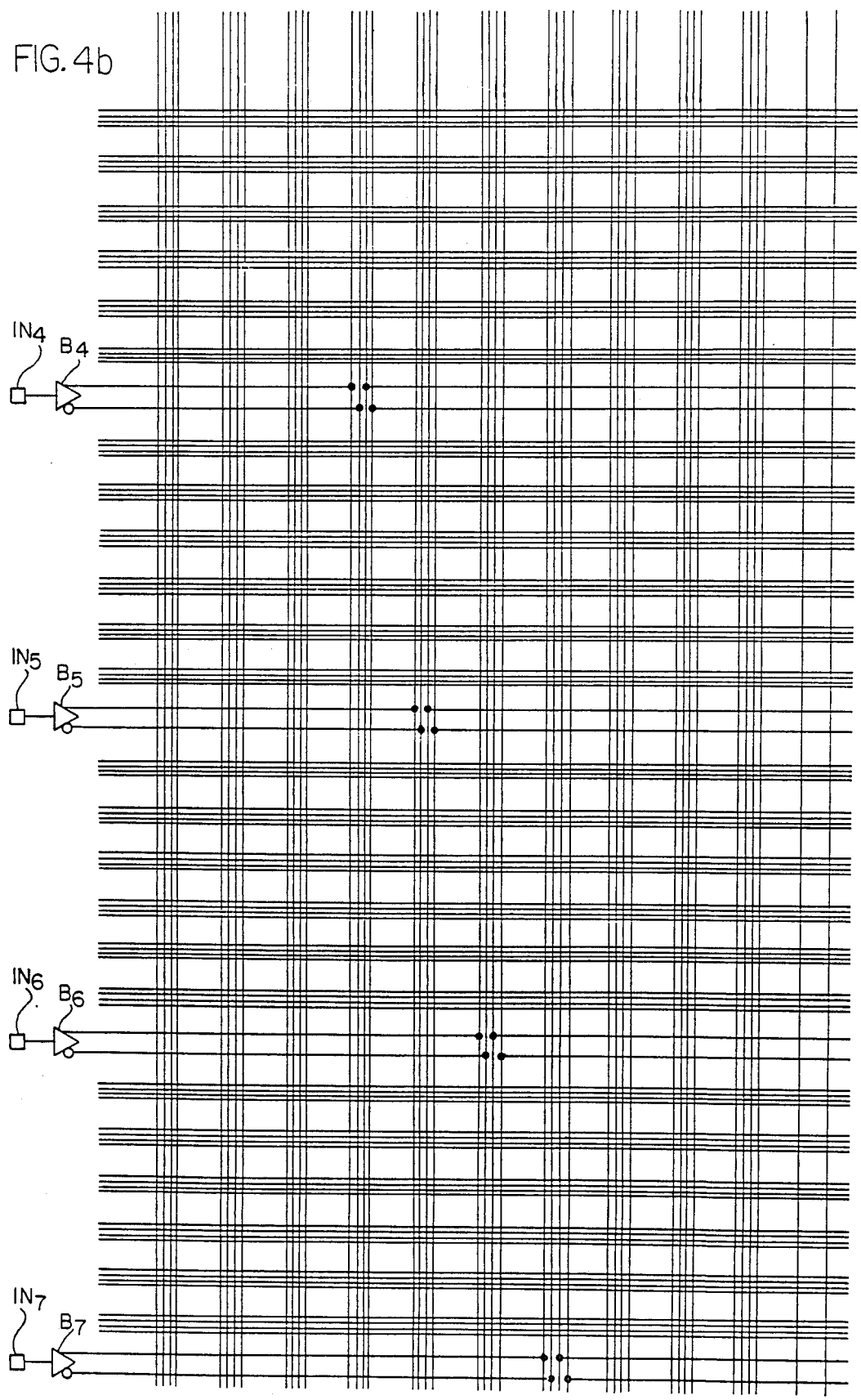

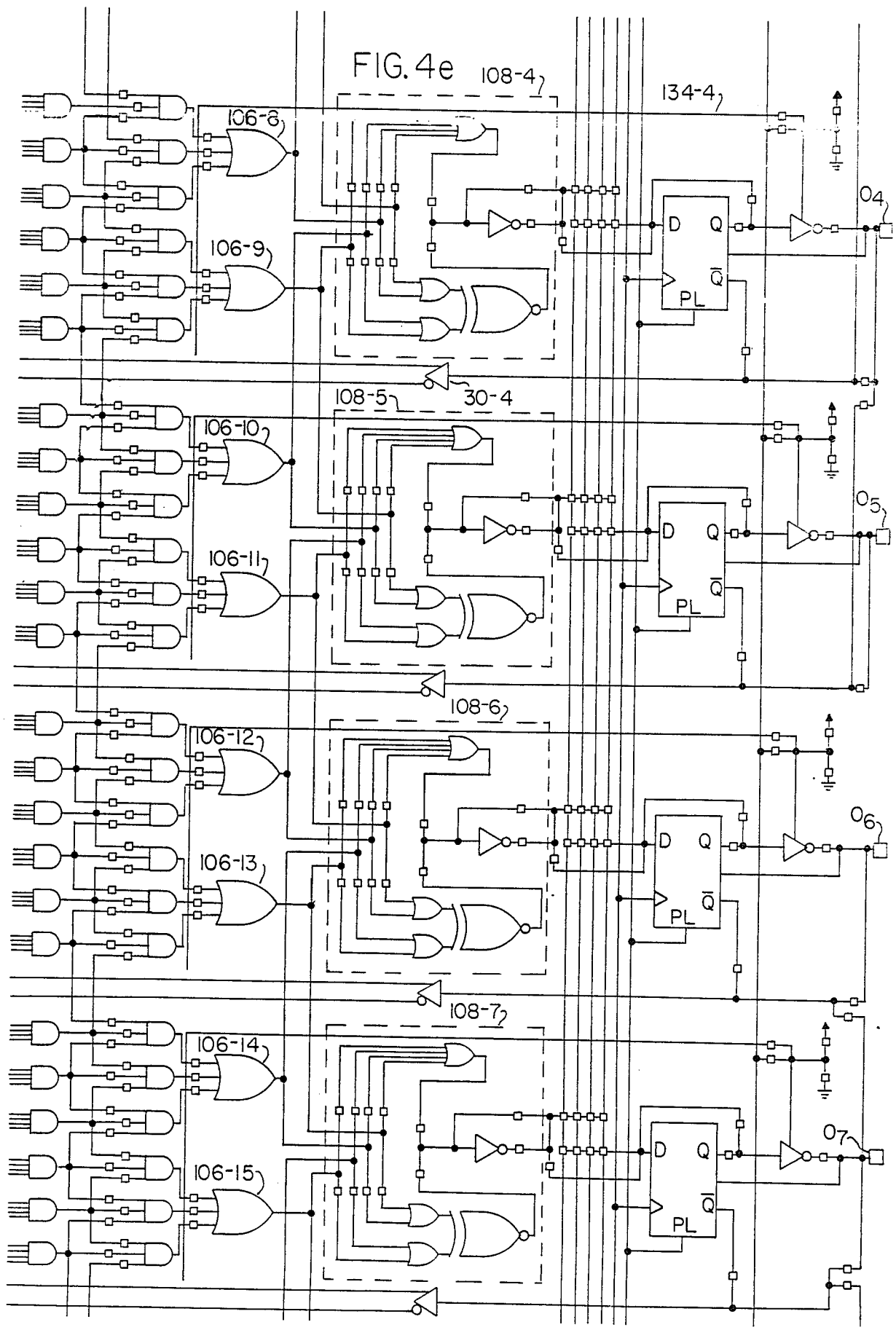

PROGRAMMABLE LOGIC ARRAY WITH ADDED ARRAY OF GATES AND ADDED OUTPUT ROUTING FLEXIBILITY

BACKGROUND OF THE INVENTION

This invention relates to the field of digital integrated circuits and more specifically to the field of programmable logic array (PLA) integrated circuits.

Programmable logic array circuits such as the circuits described in the "PAL Programmable Array Logic Handbook" published by Monolithic Memories, Inc., in 1983 are well known in the art. (PAL is a registered trademark of Monolithic Memories, Inc., the Assignee of this application.) FIG. 1 illustrates a simple PLA circuit 10. Included in circuit 10 are four input terminals $I_0$ through $I_3$, each of which is coupled to the input lead of a buffer B0 through B3, respectively. Each buffer has an inverting output lead and a noninverting output lead. For example, buffer B0 has an output lead 12a which provides a signal $\overline{IS0}$, which is the inverse of the signal present on terminal $I_0$. Similarly, buffer B0 has an output lead 12b, which provides a signal IS0, which is equal to the signal present at terminal $I_0$. Each of the output signals from buffers B0 to B3 is presented as an input signal to an AND gate 14a. AND gate 14a is an 8-input AND gate, and each of the output leads of buffers B0 to B3 is uniquely coupled to a single input lead of AND gate 14a. Thus, FIG. 2a illustrates the eight input leads to AND gate 14a. FIG. 2b illustrates AND gate 14a using the more conventional notation. In addition, fifteen other AND gates 14b to 14p are also connected to the output leads of buffers B0 through B3 in the same manner as AND gate 14a. Thus, each of AND gates 14a to 14p is coupled to all eight output leads of buffers B0 to B3. However, a purchaser of a PLA circuit has the option of severing the connection between a given buffer output lead and a given AND gate 14a to 14p. In some prior art circuits, this is done by opening a fuse similar to the fuses employed in programmable read only memories. In other prior art circuits this is done during the manufacturing process of the circuit. Regardless of how such connections are severed, the user can cause each AND gate 14a through 14p to provide a unique output signal dependent on a particular set of input signals. The output signals from AND gates 14a through 14p are sometimes referred to as the "product terms". (As used herein the expression "product term" means the logical product resulting from a logical AND operation on a plurality of input signals, e.g., $SIGNAL_1 \cdot SIGNAL_2$, while the expression "sum term" means the logical sum, resulting from a logical OR operation performed on a plurality of input signals, e.g., $SIGNAL_1 + SIGNAL_2$.)

Also, as can be seen in FIG. 1, a first OR gate 16a includes four input leads coupled to the output leads of AND gates 14m, 14n, 14o and 14p. OR gate 16a generates an output signal on an output lead $O_0$ therefrom. Similarly, an OR gate 16b receives output signals from AND gates 14i, 14j, 14k, and 14l and generates an output signal on a lead $O_1$ therefrom. In this way, programmable circuit 10 provides desired programmable Boolean functions which can be used in a variety of applications. As used in this specification, a programmable logic circuit which provides "desired programmable Boolean functions" is one which can be programmed by the system designer to provide any of a number of Boolean functions required in a given system design. This semicustom circuit provides an inexpensive replacement for a large number of logic circuits which would otherwise be required. As is known in the art, different generic types of PLA circuits include different numbers of input terminals and different numbers of output terminals.

Another type of PLA circuit is PLA 19 illustrated in FIG. 3. The array of OR gates 20a through 20d of PLA 19 are electrically programmably coupled to the output leads of AND gates 14a through 14p (i.e., the electrical connection between an AND gate and an OR gate can be severed). This is in contrast to PLA circuit 10 of FIG. 1 in which the sources of input signals for OR gates 16a through 16d are fixed and nonprogrammable.

However, PLA's including OR gates with programmable inputs have a number of disadvantages, e.g., they consume a large amount of surface area because of the need to provide additional circuitry to program the OR gate inputs. In addition, the presence of a large number of input leads to an OR gate creates a large capacitance which slows the OR gate.

SUMMARY

A programmable logic array is provided in which a second programmable array of AND gates is provided between a first array of AND gates and a first array of OR gates. Each AND gate within the first array of AND gates has an output lead programmably coupled to an input lead of a number of AND gates (in one embodiment, three AND gates) in the second array of AND gates. The output leads from the second array of AND gates are each programmably coupled to a set of OR gates within the first array of OR gates.

In one embodiment of the invention, the AND gates within the first array have a number of input leads, e.g., four, that can be programmably coupled to one of a number of input signal buffer output leads. Because the AND gates only have four input leads, they take up less space than AND gates having a larger number of input leads. In addition, in a CMOS implementation of the present invention, AND gates with a smaller number of input leads are faster than AND gates with a larger number of input leads.

By providing the second array of AND gates, it is possible to generate a product term of more than four input signals, while preserving the advantage of small AND gates. In addition, if it is desired to provide two product terms with a number of common terms, a single AND gate from the first array can be programmably coupled to two AND gates from the second array, thus using the first array of AND gates more economically.

The PLA of the present invention includes a first array of OR gates and a second array of OR gates. The OR gates within the first array of OR gates include a set of input leads (in one embodiment, 3 input leads) each input lead being programmably coupled to an output lead from the second array of AND gates. The output leads from the first array of OR gates are programmably electrically coupled to the input leads of a number of the OR gates within the second array of OR gates. The OR gates within the second array of OR gates include a set of input leads (in one embodiment, 4 input leads). This provides the advantage of being able to generate an output signal which equals the logical sum of 12 different signals without providing 12-input lead OR gates. In addition, if it is desired to provide two sum terms with a number of common terms, a single OR gate from the first array can be programmably coupled to two OR gates from the second array, thus using the first array of OR gates more economically.

In accordance with another feature of the present invention, a bus including a plurality of lines is provided, each line being programmably electrically coupled to the output leads from the second array of OR gates, each line being programmably electrically coupled to each output pin of the PLA circuit. This permits greater flexibility in routing output signals to any output pin and therefore also leads to more economical use of the gates contained in the PLA. These and other advantages of the invention are better understood with reference to the drawings below.

BRIEF DESCRIPTION OF THE DRAWINGS

FIG. 1 is a schematic diagram of a PLA constructed in accordance with the prior art.

FIG. 2a is a schematic diagram of an AND gate using the notation used in FIG. 1.

FIG. 2b is a schematic diagram of an AND gate illustrated in FIG. 2a using the more conventional notation.

FIG. 4 illustrates the manner in which FIGS. 4a to 4e are to be arranged relative to one another.

FIG. 4a to 4f are a schematic diagram of a PLA constructed in accordance with the present invention.

DETAILED DESCRIPTION

Figure 3:
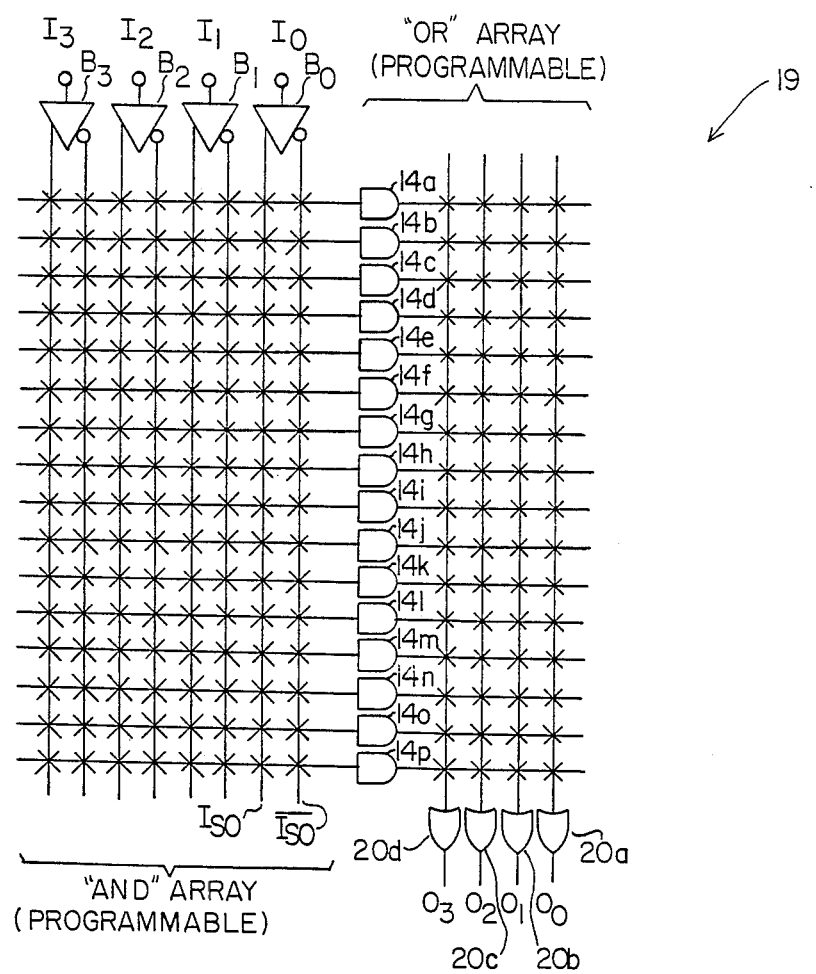
FIG. 3 is a schematic diagram of a second PLA constructed in accordance with the prior art.
Figure 4:
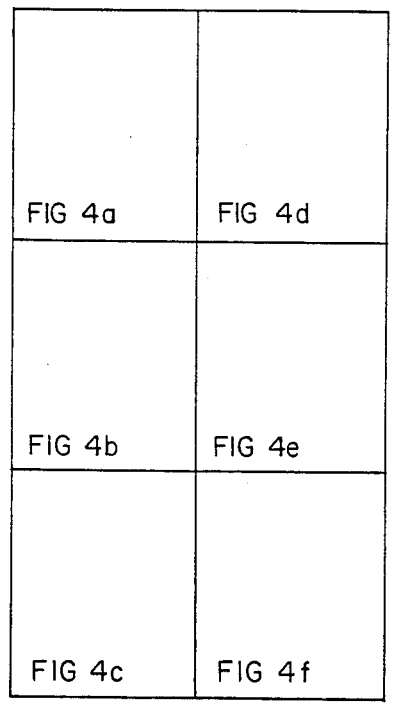

Referring to FIG. 4, a PLA circuit 100 constructed in accordance with the present invention includes several novel features which increase ease of design (i.e., ease of designing a larger system including PLA circuit 100 and determining the interconnections between the logic gates within PLA circuit 100 to provide desired logic functions), enhance flexibility, and permit a more economical use of the gates provided in PLA 100. These features include two levels of programmable AND array logic and two levels of programmable OR array logic using product and sum term sharing. Other features of this invention include a four-bit bus 110 which permits routing of output signals from the second programmable layer of OR gates to any output pin desired.

Figure 4A:
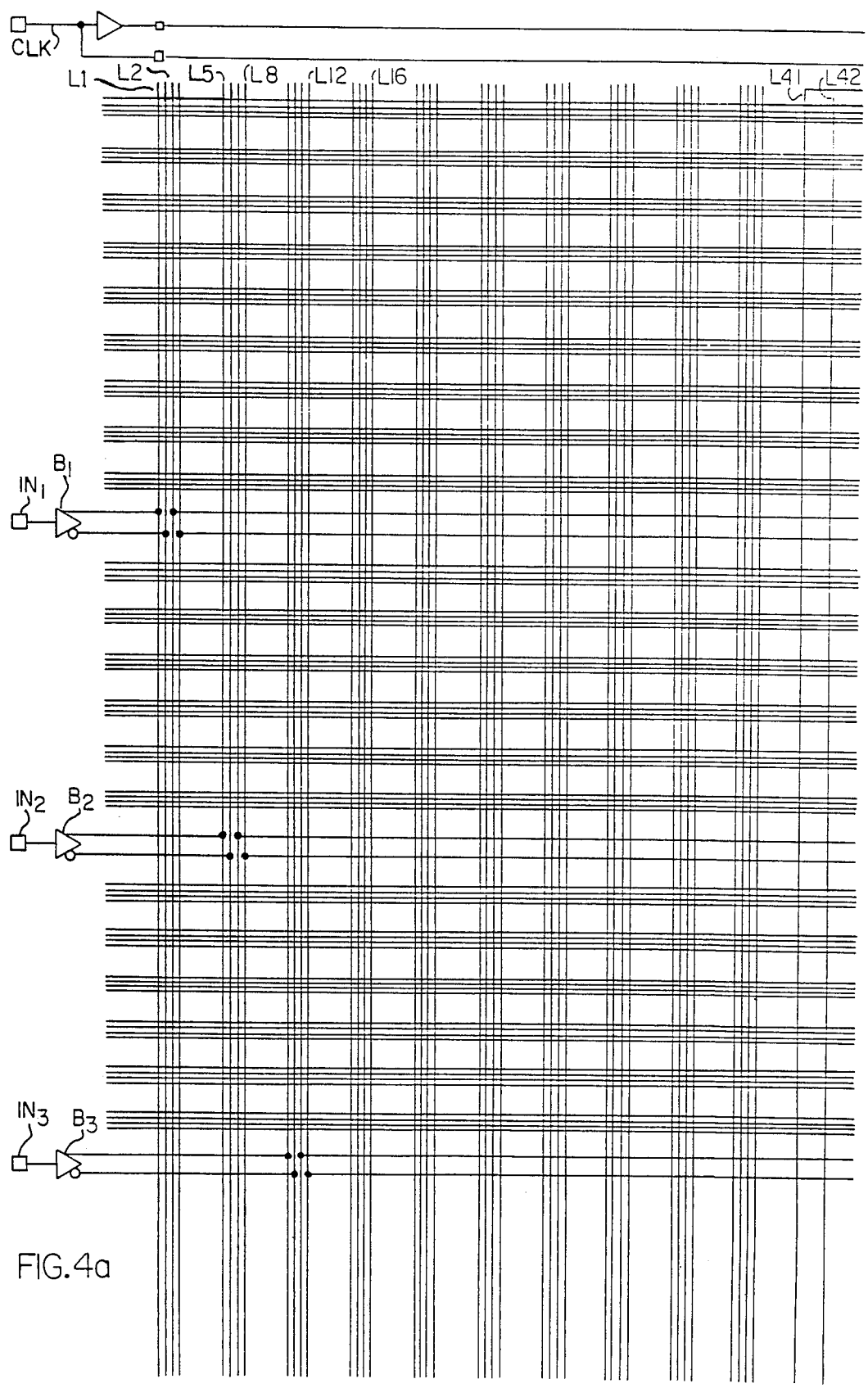
Figure 4C:
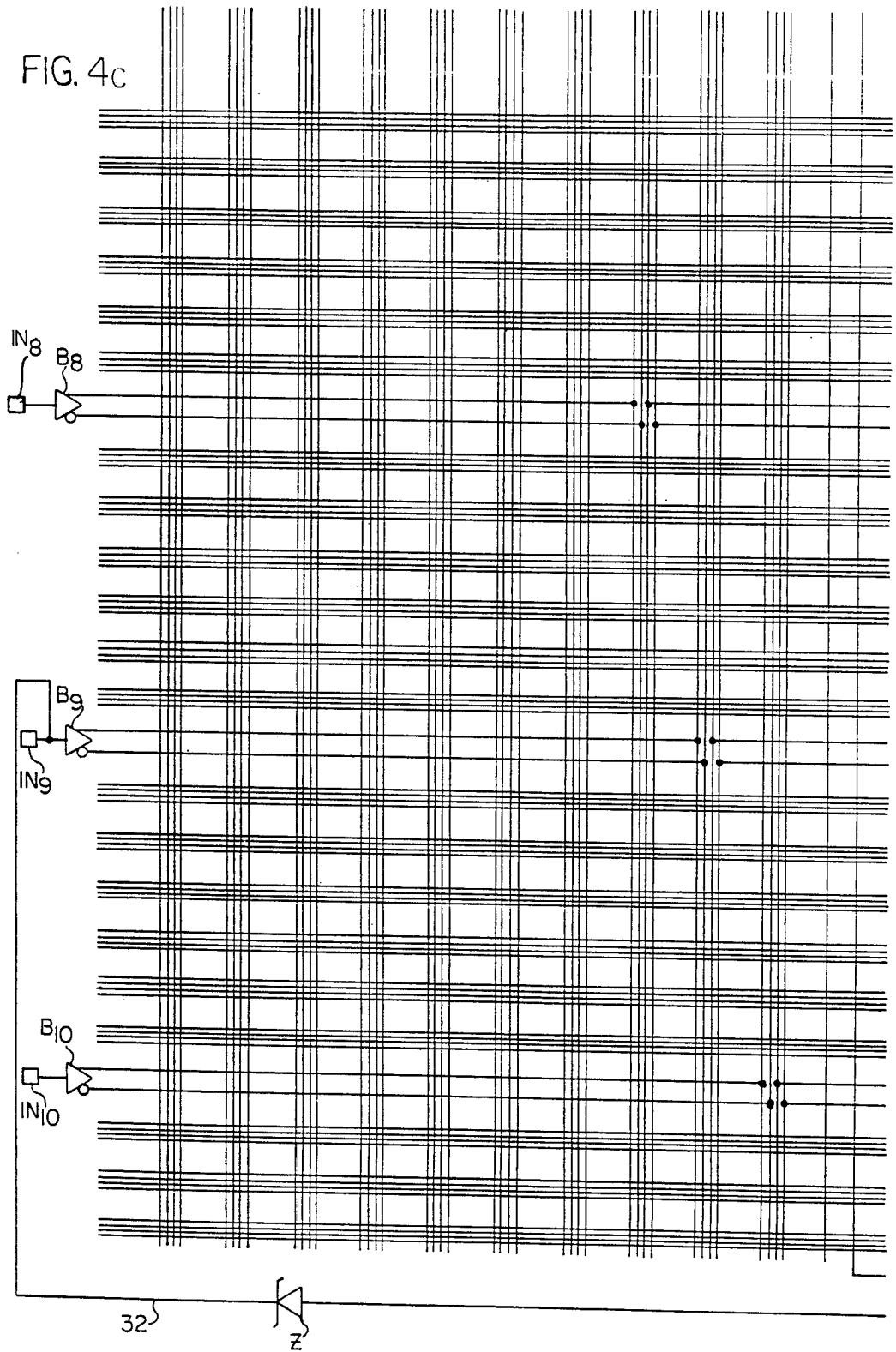
Figure 4F:
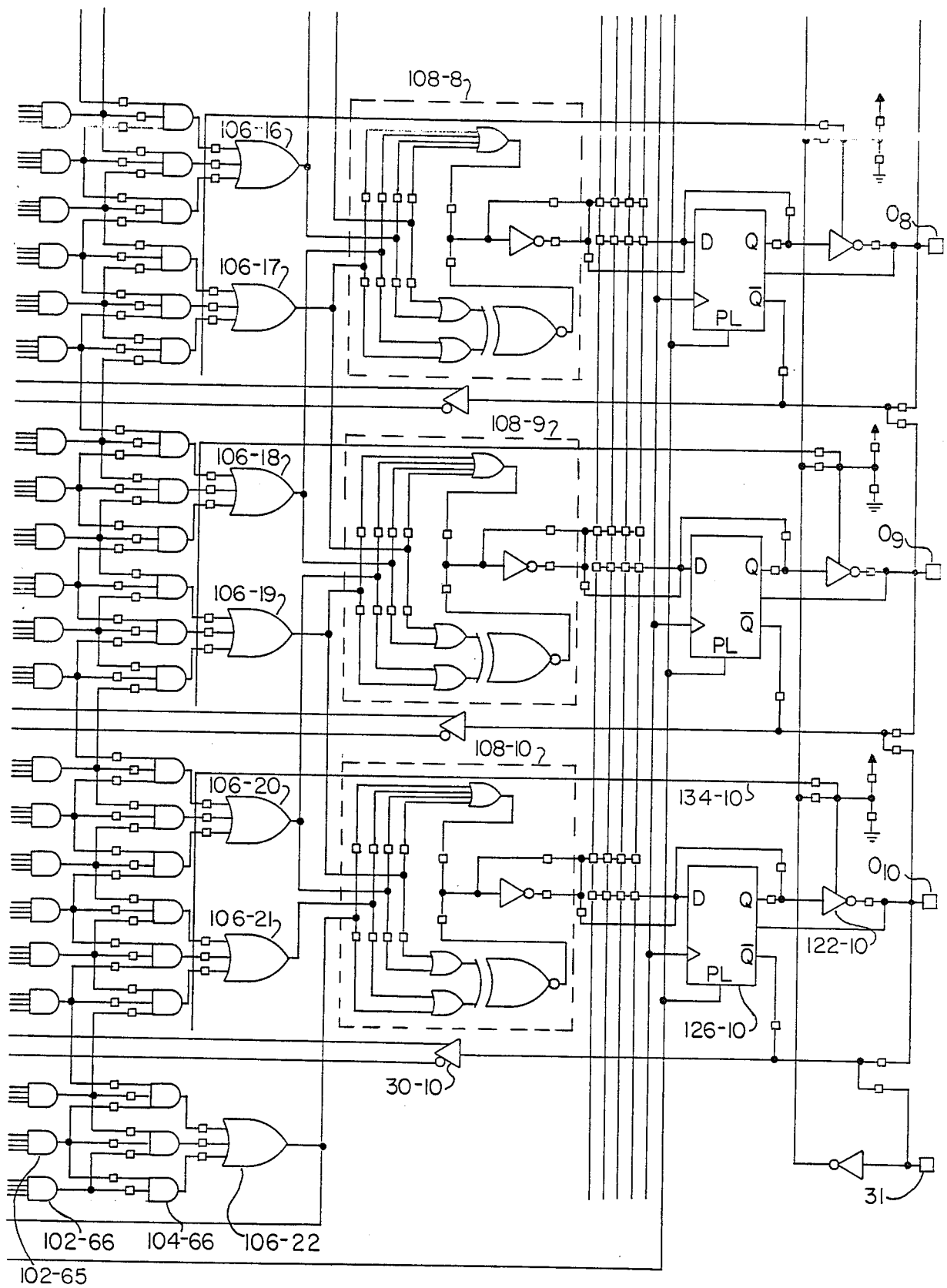
Figure 4D:
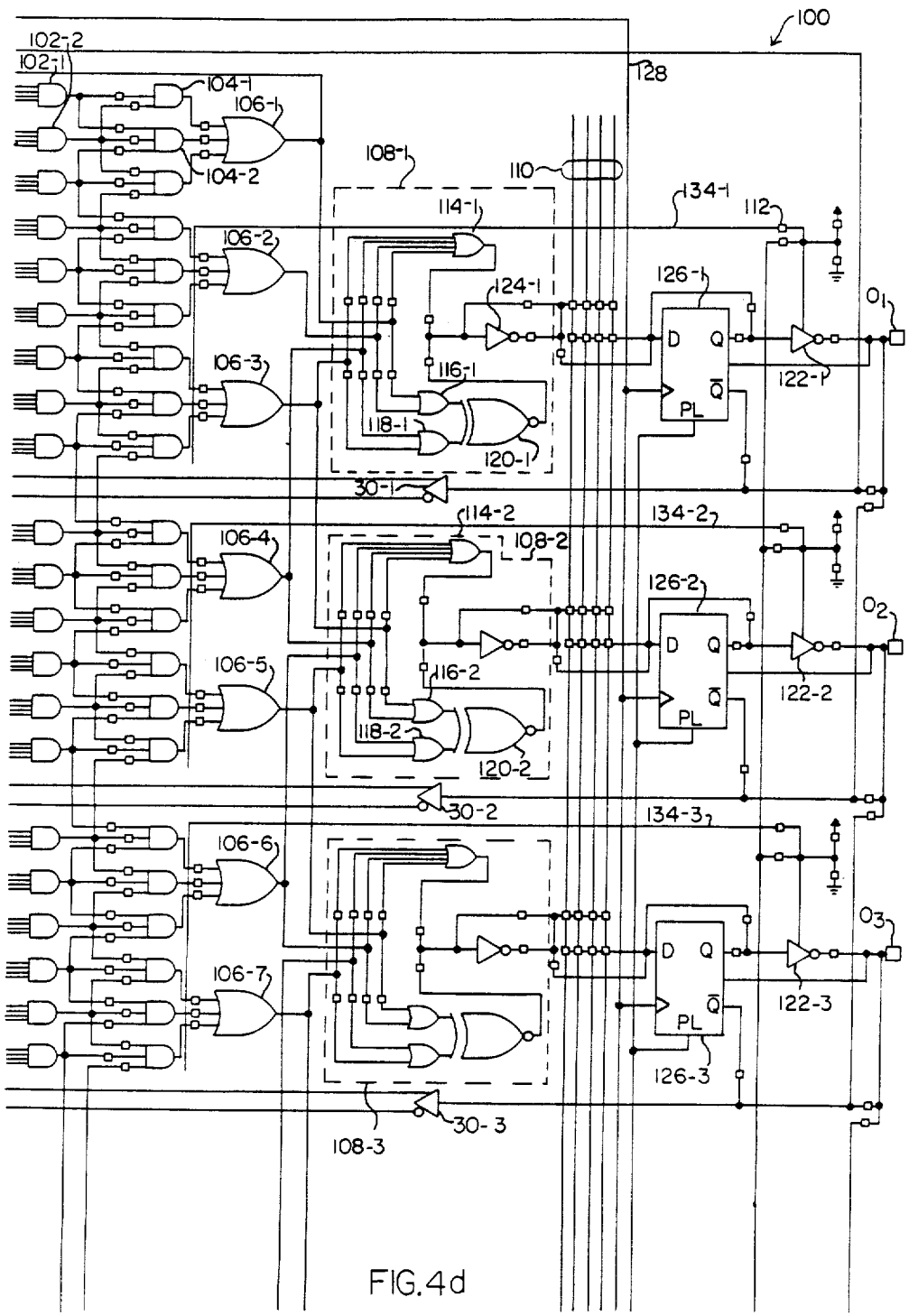

In one embodiment of the invention, PLA circuit 100 uses low power CMOS technology and is programmed during the fabrication process of the array, as is done in read only memories (ROMS). In other embodiments of the invention, PLA circuit 100 is constructed using other technologies and can be programmed by the purchaser, e.g., by opening fuses as is done in programmable read only memories, or by storing charge on floating gates as is done in electrically programmable read only memory (EPROM) technology. As can be seen in FIGS. 4d, 4e, and 4f, there are a plurality of boxes (e.g., box 112) interspersed throughout the schematic diagram. These boxes symbolically indicate a programmable electrical connection. Thus, between the output lead from AND gate 102-1 and one of the input leads of AND gate 104-1 is a programmable electrical connection that is either connected or disconnected in response to end user requirements.

PLA circuit 100 includes a first array of AND gates 102-1 through 102-66, each AND gate having four input leads. (Throughout the specification, reference is made to logic gates having a specific number of input leads. However, it should be understood that these numbers are merely exemplary, and other embodiments of the invention use logic gates having other numbers of input leads.)

Although some prior art PLA's include AND gates having a larger number of input leads, AND gates 102-1 through 102-66 are limited to four input leads. This is because in a CMOS implementation AND gates with a small number of input leads are smaller and faster than AND gates with a large number of input leads. Each input lead of AND gates 102-1 through 102-66 can be programmably electrically coupled to one of a set of lines L1 to L42. As can be seen in FIGS. 4a to 4c, the signals on some of lines L1 through L42 are generated in response to the signals present at a set of input pins $IN_1$ through $IN_{10}$ as well as the signals present on output pins $O_1$ through $O_{10}$. In this way, the customer can determine the interconnections in PLA circuit 100 so that the output signals at pins $O_1$ through $O_{10}$ as well as the input signals at pins $IN_1$ through $IN_{10}$ can be used by AND gates 102-1 through 102-66 to generate product terms. As can also be seen in the schematic diagram of FIG. 4a, the signal on line L41 is provided by an OR gate 106-1 and the signal on line L42 is provided by an OR gate 106-22. Lines L41 and L42 can be used to generate signals equal to the logical product of more than 12 signals. The signals on line L1 through L42 are input signals to the logic array.

Figure 5A:
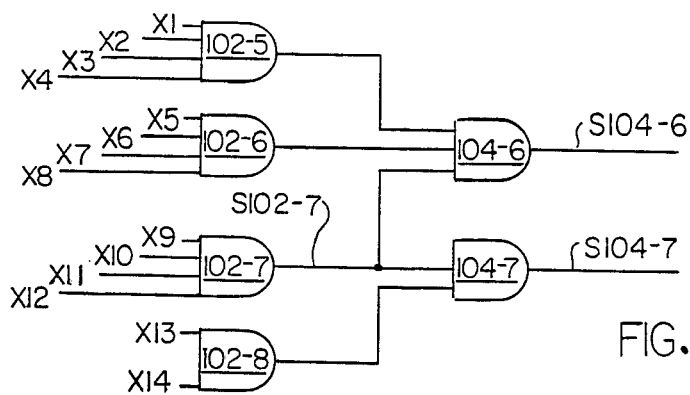
FIGS. 5a and 5b are schematic diagrams illustrating the use of various gates within the PLA circuit of FIG. 4 to generate various signals.

Each AND gate within AND gates 102-2 through 102-65 is programmably electrically coupled to an input lead of three of AND gates 104-1 through 104-66. (AND gates 102-1 and 102-66 are only programmably electrically coupled to two AND gates within AND gates 104-1 through 104-66). Thus, even though each AND gate within AND gates 102-1 through 102-66 is limited to four input signals, by providing a second group of AND gates 104-1 through 104-66, product terms including as many as 12 input signals can be generated. In addition, as will become apparent in light of the teachings of this specification, product terms generated by a first AND gate, e.g., AND gate 102-7, can be shared by a plurality of AND gates, e.g., AND gates 104-6, 104-7 and 104-8. This permits more economical use of AND gates because a single product term will not have to be generated twice. To understand why this is so, assume it is desired to produce the following signals:

$$S104\text{-}6 = X1 \cdot X2 \cdot X3 \cdot X4 \cdot X5 \cdot X6 \cdot X7 \cdot X8 \cdot X9 \cdot X10 \cdot X11 \cdot X12$$

$$S104\text{-}7 = X9 \cdot X10 \cdot X11 \cdot X12 \cdot X13 \cdot X14$$

where signals S104-6 and S104-7 are generated by AND gates 104-6 and 104-7, respectively, as illustrated in FIG. 5a. If signal S104-6 is the signal provided at the output lead of AND gate 104-6, AND gates 102-5, 102-6, and 102-7 are all required to provide input signals to AND gate 104-6. If AND gate 102-7 is used to provide a signal $S102\text{-}7 = X9 \cdot X10 \cdot X11 \cdot X12$, signal S102-7 is provided as an input signal to AND gates 104-6 and 104-7. It is seen that if the output signal from AND gate 102-7 could not be shared by AND gates 104-6 and 104-7, it would be impossible to generate signal S104-7 with AND gate 104-7 because AND gate 104-7 could only be coupled to single 4-input AND gate 102-8. Therefore, because of the unique sharing of the output signals from AND gates 102-1 through 102-66, it is now possible to generate product terms that would otherwise be impossible to generate using an array of 4-input and 3-input AND gates.

Each AND gate within AND gates 104-1 through 104-66 is programmably electrically coupled to an OR gate within OR gates 106-1 through 106-22. OR gates 106-3 through 106-20 are each programmably electrically coupled to two programmable OR gate logic circuits within OR gate logic circuits 108-1 through 108-10. The output leads of OR gates 106-1 and 106-2 are only coupled to OR gate logic circuit 108-1, and OR gates 106-21 and 106-22 are only coupled to OR gate logic circuit 108-10. By coupling the output signals from OR gates 106-3 through 106-20 to two different OR gate logic circuits 108-1 through 108-10, flexibility of design is enhanced. To understand how this is so, assume it is desired to provide signals S108-1 and S108-2 at the output leads of OR gate logic circuits 108-1 and 108-2, respectively, as described below.

$$S108\text{-}1 = (X1\cdot X2\cdot X3) + (X4\cdot X5) + (X6\cdot X7) + (X8\cdot X9)$$

$$S108\text{-}2 = (X1\cdot X2\cdot X3) + (X4\cdot X5) + (X11\cdot X12) + X13$$

Figure 5B:
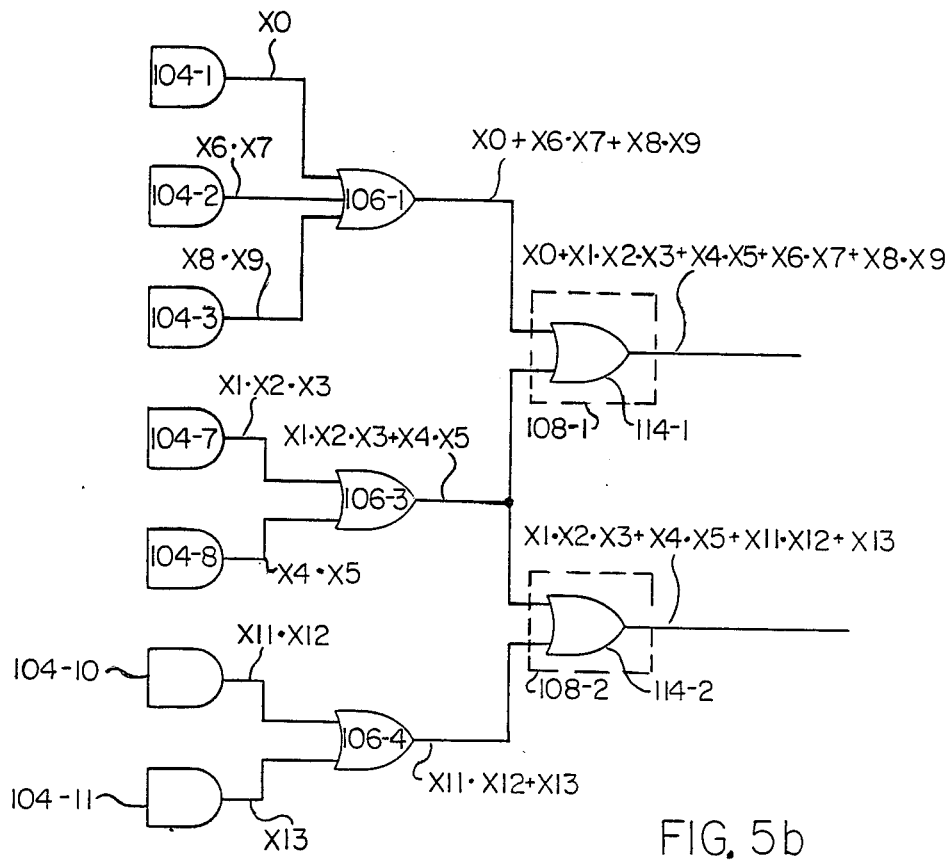

FIG. 5b is a schematic diagram of gates within PLA 100 which can be programmably interconnected to provide output signals S108-1 and S108-2. Referring to Figure 5b, because the term $(X1\cdot X2\cdot X3) + (X4\cdot X5)$ is shared between signals S108-1 and S108-2, it is only necessary to generate this term once and programmably connect this signal to two OR gates (114-1 and 114-2). Because this term does not have to be generated twice, the circuitry that would otherwise be consumed generating this term a second time (e.g., OR gate 106-5 and all the AND gates connected to OR gate 106-5) can be used for other purposes or can be unused. (Gates left unused consume less power than gates being used.)

Referring to FIGS. 4d, 4e, and 4p, it is seen that each of OR gate logic circuits 108-1 through 108-10 includes a 4-input OR gate such as OR gate 114-1, and two 2 input OR gates such as OR gates 116-1 and 118-1. OR gates 116-1 and 118-1 are coupled to an exclusive OR gate 120-1. Either OR gate 114-1 or exclusive OR gates 120-1 can be selected in response to system design requirements to generate an output term which is programmably coupled to output pin $O_1$. This output term can be presented directly to an inverter 122-1 to provide an inverted signal to output pin $O_1$, the output term can be inverted by inverter 124-1 and then presented to inverter 122-1 to provide a noninverted signal to output pin $O_1$, the output term can be stored in flip flop 126-1 and then passed on to inverter 122-1, or the output term can be inverted by inverter 124-1, stored in flip flop 126-1, and passed on to inverter 122-1, depending on system design requirements. In addition, in accordance with another novel feature of the invention, the output term generated by OR gate logic circuit 108-1 can be coupled to any of the four lines within bus 110 and coupled to any of output pins $O_2$ through $O_{10}$. This is desirable, for example, when a customer has specified a given pinout and the signal to be provided on pin $O_2$ uses all of AND gates 102-6 through 102-19 (i.e., 14 AND gates) and the signal to be provided on output pin $O_3$ requires the same number of AND gates within AND gates 102-1 through 102-66. Because of the novel routing feature provided by bus 110, the signal to be provided on output pin $O_3$ can be generated in a different part of the array, coupled to one of bus lines 110, and then presented to flip flop 126-3 or inverter 122-3 directly. Thus, bus 110 enables a system designer to select his pinout independently of the use of gates within PLA circuit 100. Although bus 110 includes only four lines, in other embodiments bus 110 has a different number of lines.

In accordance with yet another novel feature of the invention, it is seen that PLA circuit 100 receives a signal CLK which is inverted and used to clock flip flops 126-1 through 126-10 via a line 128. However, signal CLK can also be used to generate an input signal for AND gates 102-1 to 102-66 by programmably providing signal CLK to one of the lines within lines L1 through L42, e.g., lines L3 and L4 via a buffer 30-1. If that is done, and it is desired to use the output signal on pin $O_1$ to generate another one of the signals for lines L1 through L42, output pin $O_1$ can be programmably coupled to a buffer 30-2 which drives two of the lines within lines L1 through L42. Thus, by selectively programmably coupling each output pin $O_1$ to $O_{10}$ to one of two buffers, each buffer driving two of lines L1 through L42, it is possible to use both signal CLK and any nine of the output signals at pins $O_1$ to $O_{10}$ as product term input signals. Buffers 30-1 through 30-10 are also programmably coupled to receive the $\overline{Q}$ output signal of associated flip flops 126-1 through 126-10.

Similarly, it is seen in FIG. 4f that pin 31 (normally used to provide a programmable three state control signal for buffers 122-1 through 122-10) can also be used to drive two of the lines L1 through L42 via buffer 30-10. If that is to be the case, the signal present at output pin $O_{10}$ can be selectively coupled to buffer 30-9 and the output signal at pin $O_9$ can be coupled to buffer 30-8 and so on.

PLA circuit 100 includes a line 32 coupled to pin $IN_9$. Line 32, shown in FIGS. 4c and 4f, is coupled to input lead PL of flip flops 126-1 through 126-10 via a zener diode Z. Thus, when the signal at lead 32 reaches a predetermined zener breakdown voltage (for example, 12 volts), a preload signal is presented to input lead PL of each of flip flops 126-1 to 126-10 which causes flip flops 126-1 through 126-10 to store the value present at pins $O_1$ through $O_{10}$, respectively. In this way the flip flops 126-1 to 126-10 can be preset to known states. Zener diode Z prevents flip flops 126-1 to 126-10 from storing data present at pins $O_1$ to $O_{10}$ in response to a high signal at pin $IN_9$ that is less than its zener breakdown voltage. Pin $IN_9$ is also used to provide an input signal to buffer $B_9$ which responds to signals having conventional TTL voltage levels. Because of the presence of zener diode Z, a single pin can be used to provide an input signal to buffer $B_9$ that is distinguishable from a preload signal.

It is also noted that PLA circuit 110 includes a set of lines 134-1 through 134-10, each programmably coupled to the three state control line of buffers 122-1 through 122-10, respectively. Therefore, the signals on lines 134-1 through 134-10 are an alternative means for controlling buffers 122-1 to 122-10. Line 134-1 is programmably electrically coupled to the output leads of AND gates 104-4 through 104-9. Lines 134-2 through 134-10 are similarly coupled. Therefore, each of three state buffers 122-1 to 122-10 can be selectively controlled by an associated product term output signal. It is also noted that the three state control lines for each of buffers 122-1 through 122-10 can also be programmably connected to ground or VCC to force buffers 122-1 to 122-10 into a high or low impedance mode in response to system design requirements.

While the invention has been taught with specific reference to one embodiment, those skilled in the art will recognize that, changes can be made in form and detail without departing from the spirit and scope of the invention. For example, instead of bus 110 being programmably coupled to the input lead of flip flops 126-1 to 126-10, bus 110 can be programmably coupled to the output lead of flip flops 126-1 to 126-10. Accordingly, all such changes come within the scope of the present invention.

We claim:

1. A PLA comprising:

n lines for communicating n input signals, where n is an integer;

a first plurality of AND gates, each AND gate within said first plurality of AND gates having m input leads, where m is an integer and $m < n$, each input lead being programmably electrically coupled to said n lines;

a second plurality of AND gates, each AND gate within said second plurality of AND gates having a plurality of input leads, each input lead being programmably electrically coupled to an output lead of an AND gate within said first plurality of AND gates;

a first plurality of OR gates, each OR gate within said first plurality of OR gates having a plurality of input leads, each input lead being programmably electrically coupled to an associated output lead of an AND gate within said second plurality of AND gates; and a second plurality of OR gates, each OR gate within said second plurality of OR gates having a plurality of input leads programmably electrically coupled to an associated output lead of an OR gate within said first plurality of OR gates, each OR gate within said second plurality of OR gates providing an output signal.

2. A PLA comprising:

A first plurality of lines for communicating input signals;

first means electrically coupled to said first plurality of lines for providing a plurality of intermediate signals corresponding to the logical product of some of said input signals;

a second plurality of lines;

second means electrically coupled to said first means and said second plurality of lines for generating a plurality of output signals corresponding to the logical sum of some of said intermediate signals, each of said output signals being communicated on an associated line within said second plurality of lines;

a plurality of output terminals;

a third plurality of lines, each output terminal being programmably electrically coupled to each line within said third plurality of lines, each line within said third plurality of lines being programmably electrically coupled to said second plurality of lines; and a plurality of flip flops, each having an output lead programmably electrically coupled to an associated one of said output terminals, each flip flop having an input lead programmably electrically coupled to each of said lines within said third plurality of lines, each flip flop input lead also being programmably electrically coupled to said second means to receive an associated output signal within said plurality of output signals.

3. The PLA of claim 2 further comprising a buffer for providing one of said input signals, said buffer having an input lead programmably electrically coupled to at least two of said output terminals and an output lead electrically coupled to one of the lines within said first plurality of lines.

4. The PLA of claim 2 further comprising:

an input terminal for receiving an additional input signal; and a buffer having an input lead programmably electrically coupled to said input terminal and programmably electrically coupled to one of said output terminals, said buffer providing at least one of said input signals.

5. The PLA of claim 4 wherein each of said flip flops include a clock input lead coupled to said input terminal.

6. The PLA of claim 4 wherein each of said lines within said second plurality of lines is programmably electrically coupled to an associated three-state buffer, each associated three-state buffer having an output lead programmably electrically coupled to an associated output terminal, each associated three-state buffer having a three-state control line coupled to said input terminal.

7. A PLA comprising:

a plurality of input lines for communicating input signals;

a plurality of intermediate signal lines;

means electrically coupled to said plurality of input lines and said plurality of intermediate signal lines for providing a plurality of intermediate signals corresponding to the logical product of some of said input signals, each intermediate signal being communicated on an associated one of said intermediate signal lines;

a first plurality of OR gates, each OR gate within said first plurality of OR gates having an input lead coupled to one of said intermediate signal lines, each OR gate within said first plurality of OR gates having an output lead; and a second plurality of OR gates, each OR gate within said second plurality of OR gates having a plurality of input leads, each input lead within said plurality of input leads being coupled to the output lead of one of said OR gates within said first plurality of OR gates, each OR gate within said second plurality of OR gates providing an output signal.

8. The PLA of claim 7 wherein the output lead of each OR gate within said first plurality of OR gates is coupled to the input leads of at least two OR gates within said second plurality of OR gates.

9. A PLA comprising:

a plurality of input lines for communicating input signals;

a plurality of intermediate signal lines;

means electrically coupled to said plurality of input lines and said plurality of intermediate signal lines for providing a plurality of intermediate signals corresponding to the logical product of some of said input signals, each intermediate signal being communicated on an associated one of said intermediate signal lines;

a first plurality of OR gates, each OR gate within said first plurality of OR gates having an input lead programmably electrically coupled to one of said intermediate signal lines, each OR gate within said first plurality of OR gates having an output lead; and a second plurality of OR gates, each OR gate within said second plurality of OR gates having a plurality of input leads, each input lead within said plurality of input leads being programmably electrically coupled to the output lead of one of said OR gates within said first plurality of OR gates, each OR gate within said second plurality of OR gates providing an output signal.

10. The PLA of claim 9 wherein the output lead of each OR gate within said first plurality of OR gates is programmably electrically coupled to the input leads of at least two OR gates within said second plurality of OR gates.

11. A PLA comprising:
a plurality of input lines for communicating input signals;
first means electrically coupled to said plurality of input lines for providing a plurality of intermediate signals corresponding to the logical product of some of said input signals;
second means electrically coupled to said first means for providing a set of output signals corresponding to the logical sum of some of said intermediate signals;
a plurality of output terminals coupled to said second means, said plurality of output terminals receiving said output signals; and
wherein at least one input line within said plurality of input lines is programmably electrically coupled to two of said output terminals.

12. The PLA of claim 11 further comprising:
a plurality of flip flops, each flip flop being coupled to said second means, each flip flop within said plurality of flip flops for storing an associated one of said output signals, each flip flop being coupled to one of said output terminals, at least one of said flip flops being programmably electrically coupled to provide the logical inverse of said stored signal to said one input line.

13. The PLA of claim 11 wherein said plurality of input lines includes a group of input lines, each input line within said group being programmably electrically coupled to two associated ones of said output terminals.

14. The PLA of claim 11 wherein the programmable electrical coupling between said at least one input line and said two output terminals is configured so that said one input line is electrically connected to one of said two output terminals and disconnected from the other of said two output terminals.

15. A PLA comprising:
a plurality of input lines for communicating input signals;
first means electrically coupled to said plurality of input lines for providing a plurality of intermediate signals corresponding to the logical product of some of said input signals;
second means electrically coupled to said first means for providing a plurality of output signals corresponding to the logical sum of some of said intermediate signals;
an input terminal;
a three state buffer having an input lead coupled to receive one of said output signals, said buffer having a three state control line coupled to said input terminal,
and wherein one of said input lines is programmably electrically coupled to said input terminal, said one input line also being programmably electrically coupled to receive one of said output signals.

16. The PLA of claim 15 wherein said one input line is programmably electrically coupled such that said one input line receives either said one output signal or the signal present at said input terminal.

17. The PLA of claim 15 further comprising a plurality of three state buffers, each of said three state buffers within said plurality having an input lead coupled to receive one of said output signals, each three state buffer within said plurality of three state buffers having a three state control line coupled to said input terminal.

18. A PLA comprising:
a plurality of input lines for communicating input signals;
first means electrically coupled to said plurality of input lines for providing a plurality of intermediate signals corresponding to the logical product of some of said input signals;
second means electrically coupled to said first means for providing a plurality of output signals corresponding to the logical sum of some said intermediate signals;
an input terminal;
a three state buffer having an input lead programmably electrically coupled to receive one of said output signals, said buffer having a three state control line programmably electrically coupled to said input terminal,
and wherein at least one of said input lines is programmably electrically coupled to said input terminal, said one input line also being programmably electrically coupled to receive one of said output signals.

19. A PLA comprising:
a plurality of input lines for communicating input signals;
first means electrically coupled to said plurality of input lines for providing a plurality of intermediate signals corresponding to the logical product of some of said input signals;
second means electrically coupled to said first means for providing a plurality of output signals corresponding to the logical sum of some of said intermediate signals;
an input terminal;
a flip flop coupled to store one of said output signals, said flip flop having a clock input lead coupled to said input terminal,
and wherein one of said input lines is programmably electrically coupled to said input terminal, said one input line also being programmably electrically coupled to receive one of said output signals.

20. The PLA of claim 19 further comprising a plurality of flip flops coupled to store an associated one of said output signals, each flip flop within said plurality having a clock input lead coupled to said input terminal.

21. The PLA of claim 19 wherein said one input line is programmably electrically coupled such that said one input line receives either the signal at said input terminal or said one output signal.

22. A PLA comprising:
a plurality of input lines for communicating input signals;

first means electrically coupled to said plurality of input lines for providing a plurality of intermediate signals corresponding to the logical product of some of said input signals;

second means electrically coupled to said first means for providing a plurality of output signals corresponding to the logical sum of some of said intermediate signals;

an input terminal;

a flip flop programmably electrically coupled to store one of said output signals, said flip flop having a clock input lead coupled to said input terminal, and wherein one of said input lines is programmably electrically coupled to said input terminal, said one input line also being programmably electrically coupled to receive one of said output signals.

23. A PLA comprising:

a plurality of input lines for communicating input signals;

first means electrically coupled to said plurality of input lines for providing a plurality of intermediate signals corresponding to the logical product of some of said input signals;

second means electrically coupled to said first means for providing a plurality of output signals corresponding to the logical sum of some of said intermediate signals;

a plurality of output terminals electrically coupled to said second means, each output terminal communicating an associated one of said output signals; and wherein at least one output terminal within said plurality of output terminals is independently programmably electrically coupled to two of said input lines within said plurality of input lines.

24. A PLA comprising:

first means for providing a plurality of input signals;

a group of AND gates having input leads electrically coupled to said first means for providing a plurality of intermediate signals corresponding to the logical product of some of said input signals, each AND gate having an output lead, each intermediate signal being provided on the output lead of an associated one of said AND gates;

second means electrically coupled to the output leads of said group of AND gates for providing a plurality of output signals corresponding to the logical sum of some of said intermediate signals; and a three state buffer having a buffer input lead coupled to receive one of said output signals from said second means and a three state control line programmably electrically coupled to the output leads of a plurality of AND gates within said group of AND gates.

25. The PLA of claim 24 wherein the programmable electrical coupling between said three state control lead and the output leads of said plurality of AND gates is configured so that said three state control lead is connected to the output lead of one of the AND gates within said plurality and disconnected from the output leads of the other AND gates within said plurality.

26. A PLA comprising:

first means for providing a plurality of input signals;

a group of AND gates having input leads electrically coupled to said first means for providing a plurality of intermediate signals corresponding to the logical product of some of said input signals, each AND gate within said group of AND gates having an output lead, each intermediate signal being provided on the output lead of an associated one of said AND gates;

second means electrically coupled to the output leads of said group of AND gates for providing a plurality of output signals corresponding to the logical sum of some of said intermediate signals; and a three state buffer having a buffer input lead coupled to receive one of said output signals from said second means and a three state control line coupled to receive one of said intermediate signals so that said one intermediate signal is used to generate one of said output signals and to control said three state buffer.

27. A PLA comprising:

first means for providing a plurality of input signals;

a group of AND gates electrically coupled to receive said plurality of input signals from said first means for providing a plurality of intermediate signals corresponding to the logical product of some of said input signals, each AND gate having an output lead, each intermediate signal being provided on the output lead of an associated one of said AND gates;

second means electrically coupled to receive said plurality of intermediate signals for providing a plurality of output signals corresponding to the logical sum of some of said intermediate signals; and a three state buffer, having a buffer input lead coupled to receive one of said output signals from said second means and having a three state control line programmably electrically coupled to one of said AND gates, said one AND gate also being programmably electrically coupled to said second means, said one AND gate providing one of said intermediate signals.

28. A PLA comprising:

a plurality of input lines, each line communicating an input signal;

an array of AND gates, each AND gate including a plurality of input leads programmably electrically coupled to said input lines, each AND gate having an output lead;

a plurality of OR gates having a plurality of OR gate input leads, each OR gate input lead being electrically coupled to the output lead of an associated one of said AND gates, each OR gate providing an OR gate output signal on an OR gate output lead;

a plurality of output terminals; and means for programmably electrically coupling at least one of said OR gate output leads to each of said output terminals.

29. The PLA of claim 28 wherein said means for programmably electrically coupling comprises a plurality of lines, each output terminal being programmably electrically coupled to each line within said plurality of lines, each line within said plurality of lines being programmably electrically coupled to the OR gate output lead of each OR gate within said plurality of OR gates.

* * * * *

UNITED STATES PATENT AND TRADEMARK OFFICE
CERTIFICATE OF CORRECTION

PATENT NO. : 4,758,746

DATED : July 19, 1988

INVENTOR(S) : John Birkner, et al.

It is certified that error appears in the above-identified patent and that said Letters Patent is hereby corrected as shown below:

In the Abstract, line 3, "(102-1) through 102-66)" should read --(102-1 through 102-66)--.

In the Abstract, line 19, "output signals" should read --output pins--.

Col. 4, line 24, "FIG. 4a" should read --FIG. 4d--.

Col. 5, line 38, "FIGS. 4d, 4e, and 4p" should read --FIGS. 4d, 4e, and 4f--.

Add Figure 4d, attached hereto.

Signed and Sealed this

Twenty-fifth Day of April, 1989

Attest:

DONALD J. QUIGG

Attesting Officer

Commissioner of Patents and Trademarks